US011041500B2

(12) United States Patent
Barron et al.

(10) Patent No.: US 11,041,500 B2
(45) Date of Patent: Jun. 22, 2021

(54) PARALLEL-SERIES HYBRID FAN COOLING APPARATUS AND OPTIMIZATION

(71) Applicant: International Business Machines Corporation, Armonk, NY (US)

(72) Inventors: David Barron, Austin, TX (US); Rachael C. Freitas, Austin, TX (US); Howard V. Mahaney, Cedar Park, TX (US); Benjamin W. Mashak, Rochester, MN (US); George Zacharakis-Jutz, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 985 days.

(21) Appl. No.: 14/861,161

(22) Filed: Sep. 22, 2015

(65) Prior Publication Data

US 2017/0082111 A1    Mar. 23, 2017

(51) Int. Cl.
*F04D 19/00*  (2006.01)
*F04D 27/00*  (2006.01)
*G05B 15/02*  (2006.01)
*G06F 1/20*  (2006.01)
*F04D 25/16*  (2006.01)

(52) U.S. Cl.
CPC ......... *F04D 27/004* (2013.01); *F04D 19/002* (2013.01); *F04D 25/166* (2013.01); *G05B 15/02* (2013.01); *G06F 1/206* (2013.01); *F05D 2270/303* (2013.01)

(58) Field of Classification Search
CPC .............................. F04D 27/004; F04D 19/02
See application file for complete search history.

(56) References Cited

U.S. PATENT DOCUMENTS

| | | | |
|---|---|---|---|
| 6,398,505 B1* | 6/2002 | Sekiguchi | F04D 25/166 361/695 |
| 6,876,164 B2* | 4/2005 | Liu | F04D 27/008 318/434 |
| 7,142,424 B2 | 11/2006 | Malone et al. | |
| 7,430,117 B2* | 9/2008 | Shabany | H05K 7/20581 165/80.3 |
| 8,025,490 B2* | 9/2011 | Lee | F04D 19/007 415/199.4 |

(Continued)

FOREIGN PATENT DOCUMENTS

WO    2012099465 A1    7/2012

OTHER PUBLICATIONS

IBM "List of IBM Patents or Patent Applications Treated As Related".

(Continued)

*Primary Examiner* — Eldon T Brockman
*Assistant Examiner* — Michael L Sehn
(74) *Attorney, Agent, or Firm* — Patterson + Sheridan, LLP (57) ABSTRACT

A system for cooling a heat generating enclosure includes a first array of one or more fans of a first size and a second array of one or more fans of a second size, where the second array is in series to the first array. The system also includes a measuring unit configured to measure at least one process variable. The system also includes a control unit configured to control at least one of the fans in the first array or at least one of the fans in the second array based on the process variable, wherein the fans are controlled to achieve an optimization criterion.

11 Claims, 7 Drawing Sheets

(56) References Cited

U.S. PATENT DOCUMENTS

| | | | |
|---|---|---|---|
| 8,183,729 B2* | 5/2012 | Takeuchi | H02K 15/026 |
| | | | 310/114 |
| 8,360,735 B2 | 1/2013 | Hanaoka et al. | |
| 8,706,315 B2 | 4/2014 | Sato | |
| 2011/0035606 A1 | 2/2011 | Lovicott et al. | |
| 2011/0164384 A1 | 7/2011 | Vogel et al. | |
| 2012/0020780 A1 | 1/2012 | Uchiyama et al. | |
| 2014/0138068 A1 | 5/2014 | Nienberg et al. | |
| 2014/0240917 A1 | 8/2014 | Nicolai et al. | |

OTHER PUBLICATIONS

U.S. Appl. No. 14/930,217, entitled Parallel-Series Hybrid Fan Cooling Apparatus and Optimization, filed Nov. 2, 2015.
"Multiple Fan Systems—Fans in Series and Parallel (FA/115-02)", Greenheck Fan Corporation, Oct. 1, 2002, http://www.greenheck.com/library/articles/42, 3 pages.
"The Parallel and Series Operations", Sunon, 1 page.
U.S. Appl. No. 14/861,161, entitled Parallel-Series Hybrid Fan Cooling Apparatus and Optimization, filed Sep. 22, 2015.

\* cited by examiner

PARALLEL-SERIES HYBRID FAN COOLING APPARATUS AND OPTIMIZATION

BACKGROUND

The present disclosure relates to a method for cooling an enclosure, and more specifically, a method for optimizing cooling using arrays of fans.

In modern computer systems, forced air convection cooling is often the preferred method for cooling heat generating enclosures. Heat generating enclosures may include servers, workstations, laptops, generators, engines, printers, fax machines, any electronic enclosure, or any system cooled with forced air convection. Many systems use an array of small fans on one side of the enclosure. Small fans can deliver targeted airflow, but may suffer from poor mechanical efficiency. Large fans have better mechanical efficiency, but provide the same flow rate to a relatively large swept area. Therefore, large fans are good for cooling large areas but are not as good as small fans when heat flux is highly varied. For instance, if a single chip in an array of nine chips needs cooling, a single small fan directed at that chip is ideal. If eight chips in the array of nine chips need cooling, a large fan may be more efficient.

SUMMARY

According to one embodiment, a system for cooling a heat generating enclosure is disclosed herein. The system includes a first array of one or more fans of a first size and a second array of one or more fans of a second size, wherein the second array is in series to the first array. The system further includes a measuring unit configured to measure at least one process variable. The system also includes a control unit configured to control at least one of the fans in the first array or at least one of the fans in the second array based on the process variable, wherein the fans are controlled to achieve an optimization criterion.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be adapted for use with other embodiments.

DETAILED DESCRIPTION

In embodiments described herein, cooling within a heat generating enclosure may be optimized by positioning an array of small cooling fans on heat generating areas, along with a plurality of large cooling fans in series with the array of small fans. A central control unit is in communication with the small fans and/or the large fans. The control unit incorporates a method of analyzing process variables in order to optimize the speeds of the fans to adequately cool the enclosure (i.e., to achieve an optimization criterion or criteria). Example process variables may include air temperature, chip temperature, fan power, processor usage, or incoming compute requests. The system optimizes cooling efficiency and allows for accurate cooling while not relying solely on small inefficient fans. Cooling efficiency could comprise meeting a temperature specification while minimizing other parameters, such as acoustics or power usage. Cooling efficiency could also comprise meeting a power or acoustic specification in addition to a temperature specification.

Large fans and small fans have different cooling efficiencies. As one example, for a Delta® FFB series of fans, a 120 mm fan operating at 24 volts is up to 100% more efficient, on a cubic feet per meter (CFM) per watt basis, compared to a 40 mm fan of the same series and voltage. The advantage of the small fan is more directed airflow. Small parallel fans mounted directly on a server can be used to cool a specific area, while large fans may span a larger surface area than the heat generating area.

Several factors determine the efficiency of a fan. Hydraulic loss is caused by the friction between the fluid and the walls of the fan. The surface area per CFM is larger for small fans because more fans are needed to supply a given amount of CFM than large fans. If the surface finish and the friction factor is the same for large and small fans, the more surface area of the small fans leads to higher hydraulic losses for small fans on a CFM basis.

Mechanical loss is caused by friction in bearings and gears in fans. A greater number of smaller fans are required to supply the same area with the same CFM as compared to large fans. Thus, there will be more bearings and more friction.

Electrical loss is caused by the conversion of electrical energy to rotational energy. Smaller motors are typically less electrically efficient than larger motors, and therefore smaller fans are less electrically efficient than larger fans.

Volumetric loss is caused by leakage of fluid. These losses are typically a function of fan speed and fluid momentum. These losses are often only significant at very low revolutions per minute (RPM), where the pressure differential is not maintained due to the fan blades not circulating fast enough compared to the impedance.

The tip speed of a rotating blade determines the peak efficiency of transforming rotational energy to kinetic energy. Longer fan blades increase the tip speed with no change to the motor revolution rate, which yields an increase in efficiency. Therefore, due to the higher hydraulic, mechanical, and electrical losses, and slower tip speeds, smaller fans are typically less efficient than larger fans.

Figure 1:
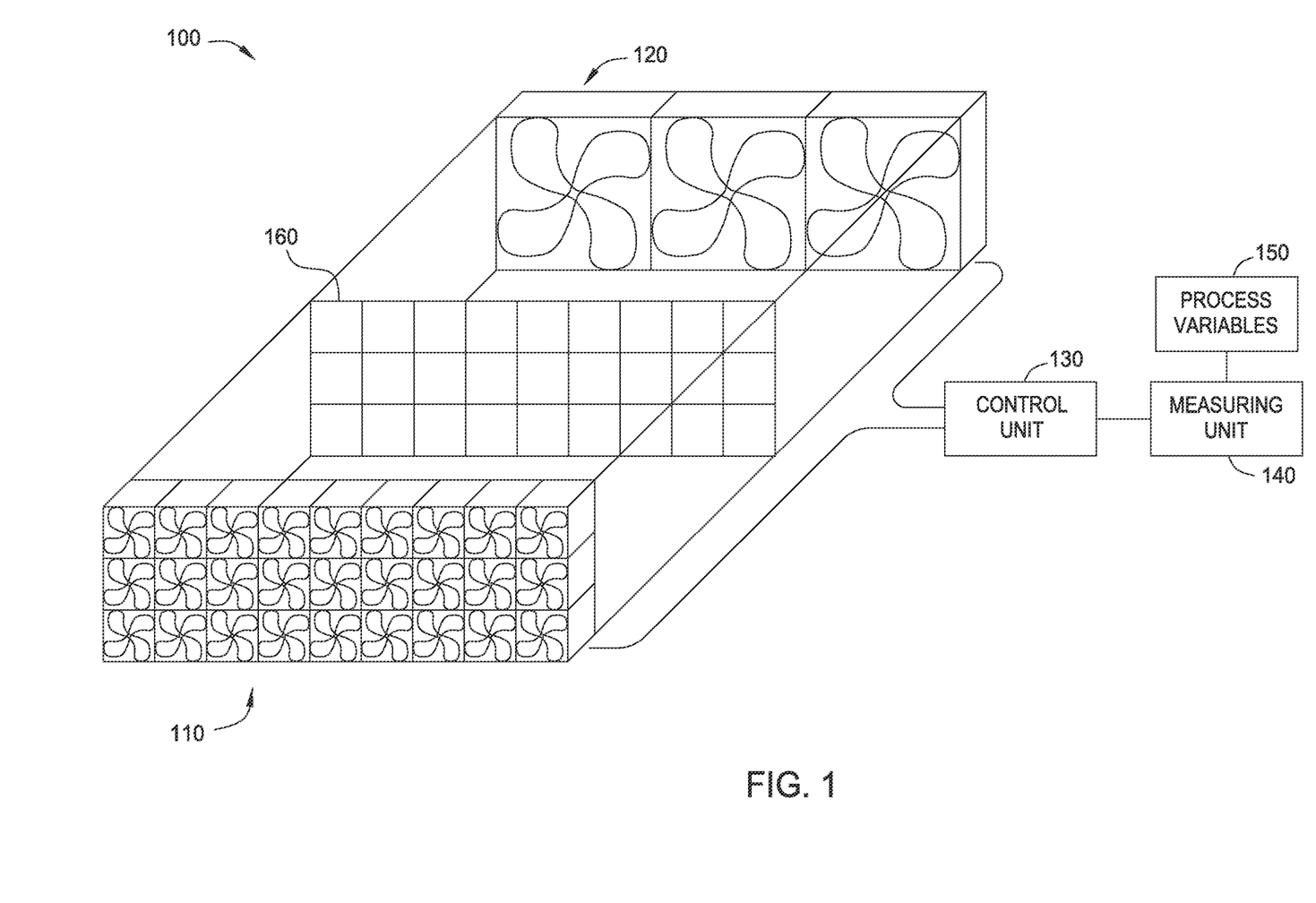
FIG. 1 illustrates a block diagram of a parallel-series hybrid fan configuration, according to one embodiment disclosed herein.

FIG. 1 illustrates a system 100 of a parallel-series hybrid fan configuration, according to one embodiment disclosed herein. System 100 comprises a parallel array 110 of small fans. Twenty-seven small fans are illustrated in this example array, although any suitable number may be used and the fans may be configured in any suitable configuration. Small fans may be less efficient than larger fans, but small fans allow cooling to be targeted on a specific area. System 100 further comprises a parallel array 120 of large fans. The array 120 of large fans is in series to the array 110 of small fans. Three large fans are illustrated in this example, although any suitable number may be used and the fans may be configured in any suitable configuration. The arrays may be placed on opposite sides of the heat generating enclosures, or on the same side of the enclosure.

Representative heat source 160 is a conceptual model that illustrates heat generation along a plane. The heat source model is divided into a grid, and shows the heat output within each of the swept areas of the small fan blades. In other embodiments described below, the heat source 160 will be shaded to illustrate areas of high, low, or no heat. The distribution of heat in those areas is one factor that may be used to determine the speeds of each of the fans, in order to optimize cooling of the heat generating enclosure.

Fan control unit 130 controls the speed of the fans in one example embodiment. The fan control unit 130 may comprise any suitable hardware, software, or a combination thereof that is configured to control the speed of one or more fans. Fan control unit 130 may comprise a microcontroller or microprocessor. Fan control unit 130 may include any appropriate memory as well. Fan control unit 130 receives input of a process variable, either through measurement or communication, and uses that process variable to calculate an optimization criterion (or optimization criteria). Then, the speed of one or more fans can be set by the fan control unit 130 to implement a cooling strategy. Temperature or cooling efficiency may be optimized in some embodiments as part of the cooling strategy. Other criterion that may be optimized includes noise, fan life, or component life, which may be optimized to implement the cooling strategy.

A global fan control may be used for all sets of fans, or separate fan controls may be used for each set of fans. A set of fans may be native to the enclosure and controlled by integrated fan control in some embodiments. Other fan arrays may or may not be in communication with the native fan controller. More than one set of fans may be native to the enclosure, or no sets of fans may be native to the enclosure.

Measuring unit 140 is operable to measure one or more process variables in this example embodiment. Any number of measuring units 140 may be utilized; only one is illustrated here for simplicity. In addition, the measuring units 140 may comprise any appropriate gauge, sensor, instrument, scale, measuring device, service processor, or indicator used to determine the value of a process variable. For example, temperature sensors may determine temperature at a point within an enclosure. Fan power may be measured by a measuring unit 140. A processor usage metric may be measured by a measuring unit 140. Other examples will be described in further detail below.

Process variables 150 are also illustrated in FIG. 1. Process variables 150 are utilized by the fan control unit 130 to optimize cooling within a heat generating enclosure. Process variables 150 may be determined by a measuring unit 140. A number of process variables within an enclosure containing a typical computer/server may be easily acquired, or acquired in the course of routine operation. As noted above, any suitable measuring unit 140 may be utilized to acquire a value of a process variable 150. While the examples described herein focus on cooling efficiency, other criteria such as noise, fan life, or component life may be optimized in certain embodiments.

Many process variables 150 related to temperature may be utilized in system 100. For example, air temperature or enclosure temperature may be measured. A service processor can be queried for chip temperatures. Thermal imaging may be used to determine one or more temperatures. Fan tachometer data may be measured or queried. Air flow rate may be measured and used to infer temperature. In liquid-cooled systems, process variables may include inlet water temperature, outlet water temperature, pump speed, or pump pulse width modulation (PWM).

Process variables 150 related to hardware may also be utilized. For example, fan power may be measured and used as a process variable. Rack power may also be a process variable. Fan noise could be a process variable. Finally, power from a power distribution unit may also be utilized as a process variable.

Process variables 150 related to processing instructions could also be utilized for cooling optimization. For example, processor or graphics processing unit (GPU) percentage usage could be measured and used as a process variable. For example, a higher processor usage may require more cooling for the system or for a specific chip. I/O (input/output) rate may be a process variable. Finally, incoming compute requests could also be a process variable in certain embodiments.

Figure 2:
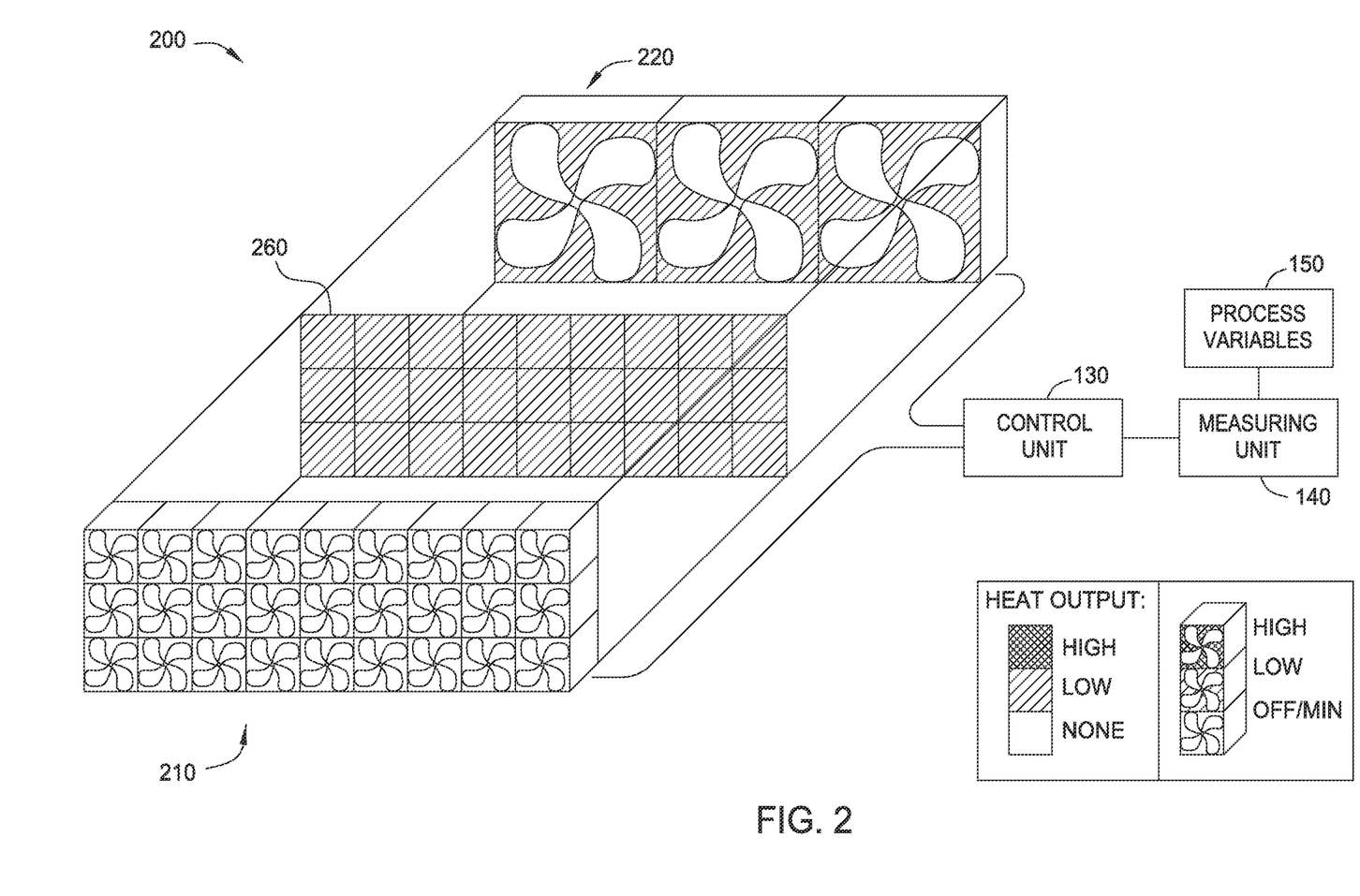
FIG. 2 illustrates an example fan configuration under a heat flux scenario, according to one embodiment disclosed herein.

FIG. 2 illustrates an example fan configuration under a constant heat flux scenario. In this scenario, the heat generation 260 is uniform and constant at a low heat output, as shown in the key. In this example, measuring unit 140 determined that a process variable 150 of air temperature is at a low or intermediate level, as illustrated by the light shading of plane 260. In this scenario, an efficient cooling strategy would be to turn off the less efficient small fans and only use the large fans to provide the necessary CFM. As shown, the small fans in array 210 are turned off or at a low speed, as illustrated by no shading. The large fans in array 220 are set to an intermediate speed, as illustrated by the light shading. Fan control unit 130 implements the cooling strategy by adjusting the speeds of the fans in arrays 210 and 220.

Figure 3:
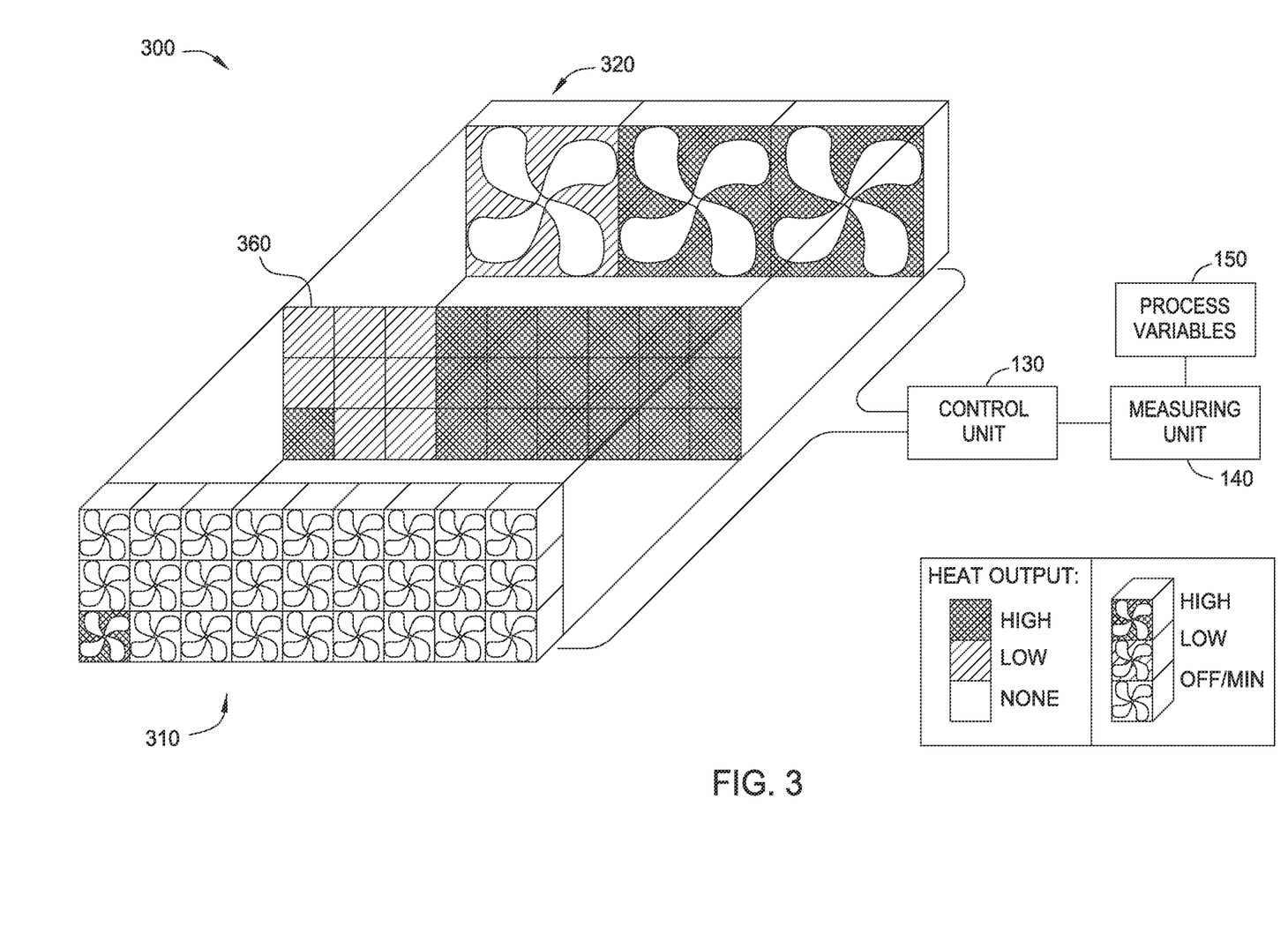
FIG. 3 illustrates an example fan configuration under another heat flux scenario, according to one embodiment disclosed herein.

FIG. 3 illustrates an example fan configuration under another heat flux scenario. In this scenario, the heat generation 360 is high along the right two-thirds of the plane. In addition, there is a small area of high heat output in the lower left corner of the plane. These are identified by a darker shading on the figure. The rest of the plane illustrating heat generation 360 shows low heat output, identified by a lighter shading. In this scenario, an efficient cooling strategy would be to use the two large fans in the center and right of array 320 to cool the high heat regions along the right two-thirds of the heat generation plane 360. In addition, the leftmost fan in array 320 could be turned on to a low speed. Therefore, all of the sections are cooled with a baseload of flow from the efficient large fans in array 320. However, the small fan in the bottom left of array 310 can be turned on high, as shown, to cool the small area of high heat output in the lower left corner of heat generation plane 360.

Figure 4:
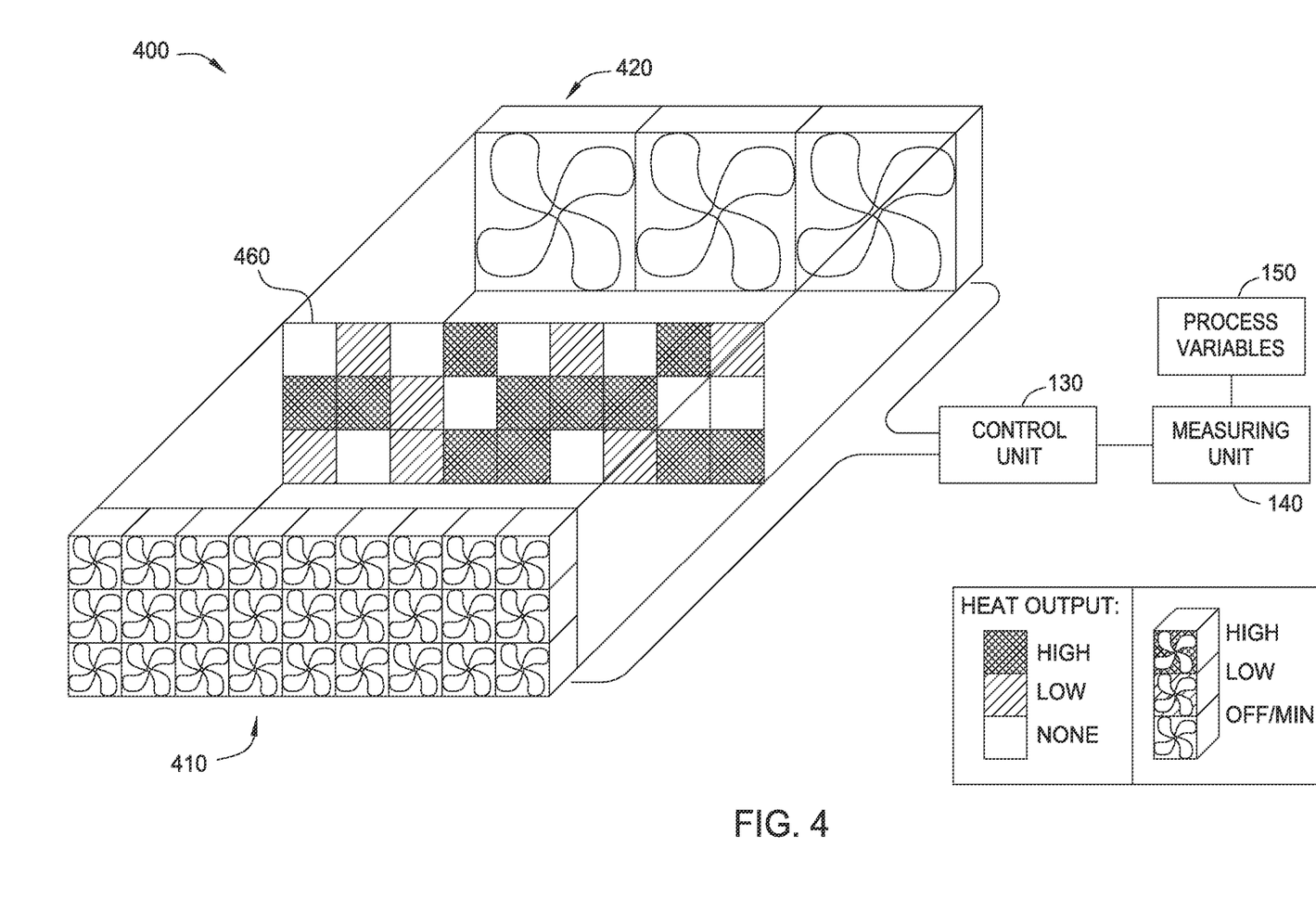
FIG. 4 illustrates an example fan configuration under another heat flux scenario, according to one embodiment disclosed herein.

FIG. 4 illustrates another scenario 400 where the heat flux 460 in every region is varied and the optimization is a more complex problem. The most optimal solution is going to be a function of the efficiency of the large fans 420 over large areas balanced by the targeted air flow from the smaller fans 410. For instance, although not illustrated in FIG. 4, the most efficient cooling scheme might consist of the two rightmost large fans operating at a higher CFM than the large fan on the left due to the greater average heat flux in their respective swept areas. The small fans 410 could supplement the large fans in specific areas in order to provide the required cooling. The optimum cooling efficiency is therefore possible with a method of communication and control between the hybrid system consisting of banks of different sized parallel fans in series with each other.

Figure 5:
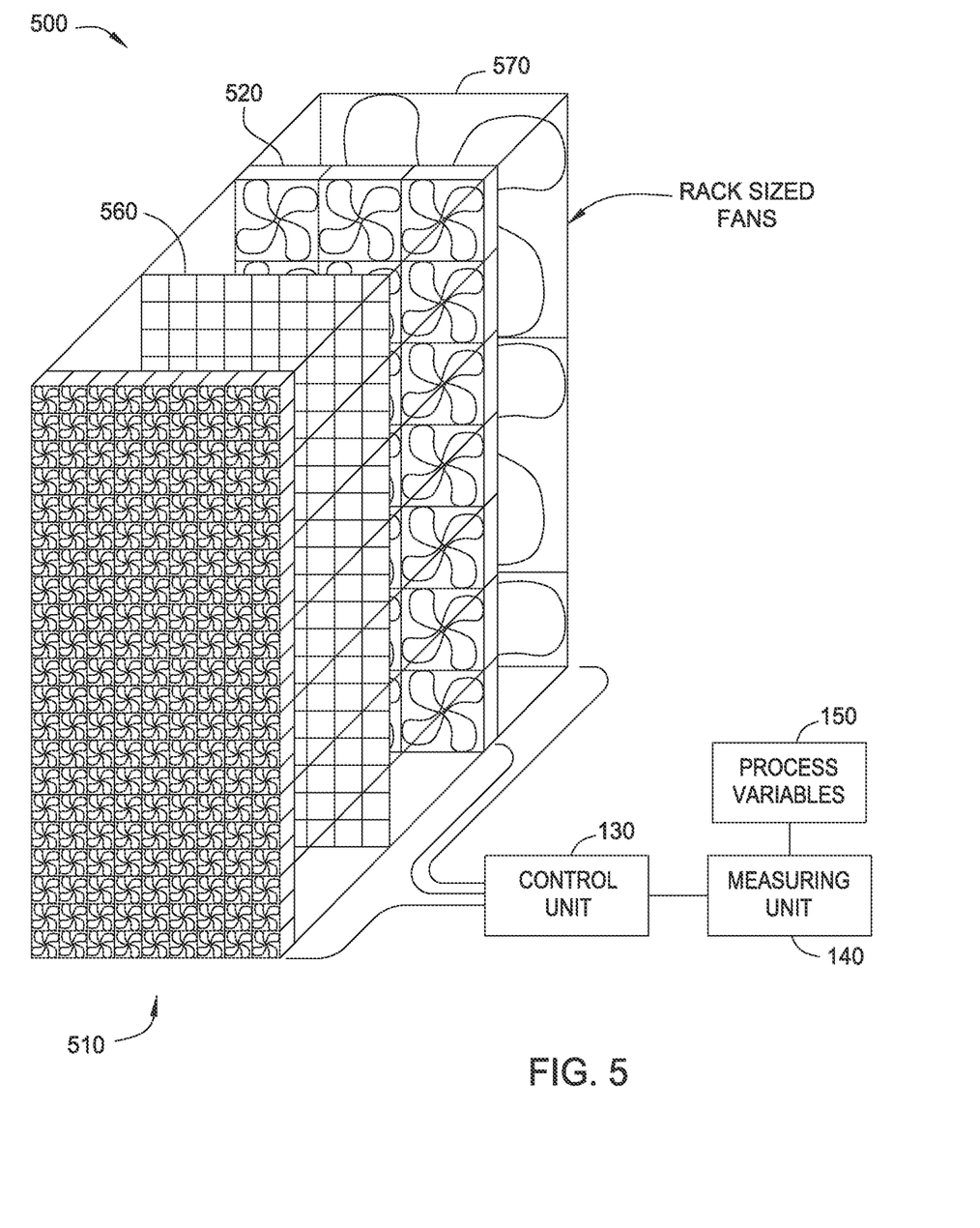
FIG. 5 illustrates an example rack level fan configuration according to one embodiment disclosed herein.

FIG. 5 illustrates an example rack level fan configuration 500 according to one embodiment disclosed herein. As shown, plane 560 illustrates the heat generation plane. An array of small fans 510 is used in conjunction with an array of large fans 520. Additionally, rack-level fans 570 may comprise a third array of fans used to provide a large base level of cooling, if necessary. Process variables 150 are utilized by the fan control unit 130 to optimize cooling within the heat generating enclosure.

Figure 6:
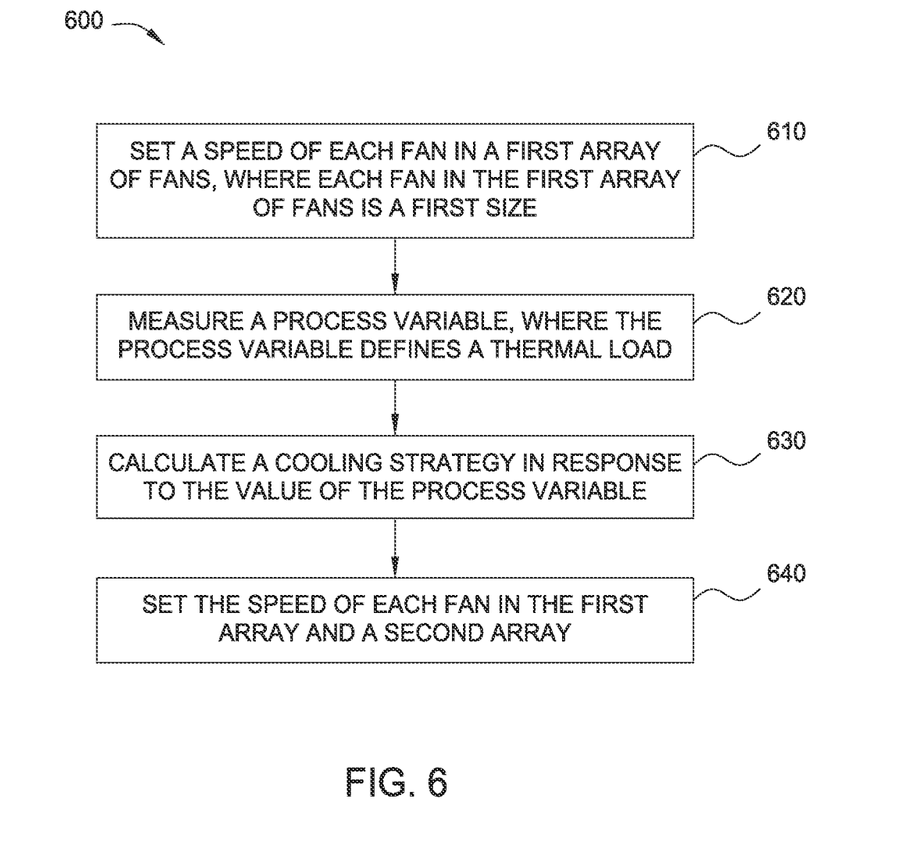
FIG. 6 illustrates a flowchart of a method for cooling a heat generating enclosure, according to one embodiment disclosed herein.

FIG. 6 is a flowchart of a method for cooling a heat generating enclosure, according to an embodiment. Although the method steps are described in conjunction with the systems of FIGS. 1-5, persons skilled in the art will understand that any system configured to perform the method steps, in any order, falls within the scope of the present invention. In various embodiments, the hardware and/or software elements described above in FIGS. 1-5 can be configured to perform the method steps of FIG. 6. In some embodiments, the components illustrated in FIGS. 1-5, such as the fan control unit 130 and measuring unit 140, may perform some or all of the steps in FIG. 6, utilizing hardware and/or software. The method described in FIG. 6 utilizes two arrays of fans, but any number N of arrays of fans may be used in other embodiments.

As shown, a method 600 begins at step 610 where a fan control unit sets a speed of each fan in a first array of fans, where each fan in the first array of fans is a first size. The speeds of the fans may be set individually, or the speed of the fans may be set in groups.

The method proceeds to step 620, where a measuring unit measures a process variable. As described above, processing variables may be related to temperature, hardware, or processing instructions. As an example, air temperature may be a process variable. Another process variable may be incoming compute requests.

At step 630, a cooling strategy is calculated in response to the value of the process variable. Fan control unit 130 may calculate an optimum cooling strategy based on one or more process variables.

The method proceeds to step 640, where the speed of each fan in the first array of fans and the speed of each fan in a second array of fans is set to achieve the optimization criteria. The second array of fans is in series to the first array of fans and each fan in the second array of fans is a second size. In addition, the speed of each fan in the first or second array may be set to implement the cooling strategy or achieve the optimization criterion. As described above, each fan in any array may be set to a different speed to implement the cooling strategy. The fan control unit may continually receive process variables and adjust the speeds of the fans as needed. In other embodiments, the fan speeds may be set for only one of the fan arrays. The fan control unit may also receive process variables and/or adjust the speeds of the fans based on a predetermined timing, such as adjusting or resetting fan speeds every X number of seconds.

Figure 7:
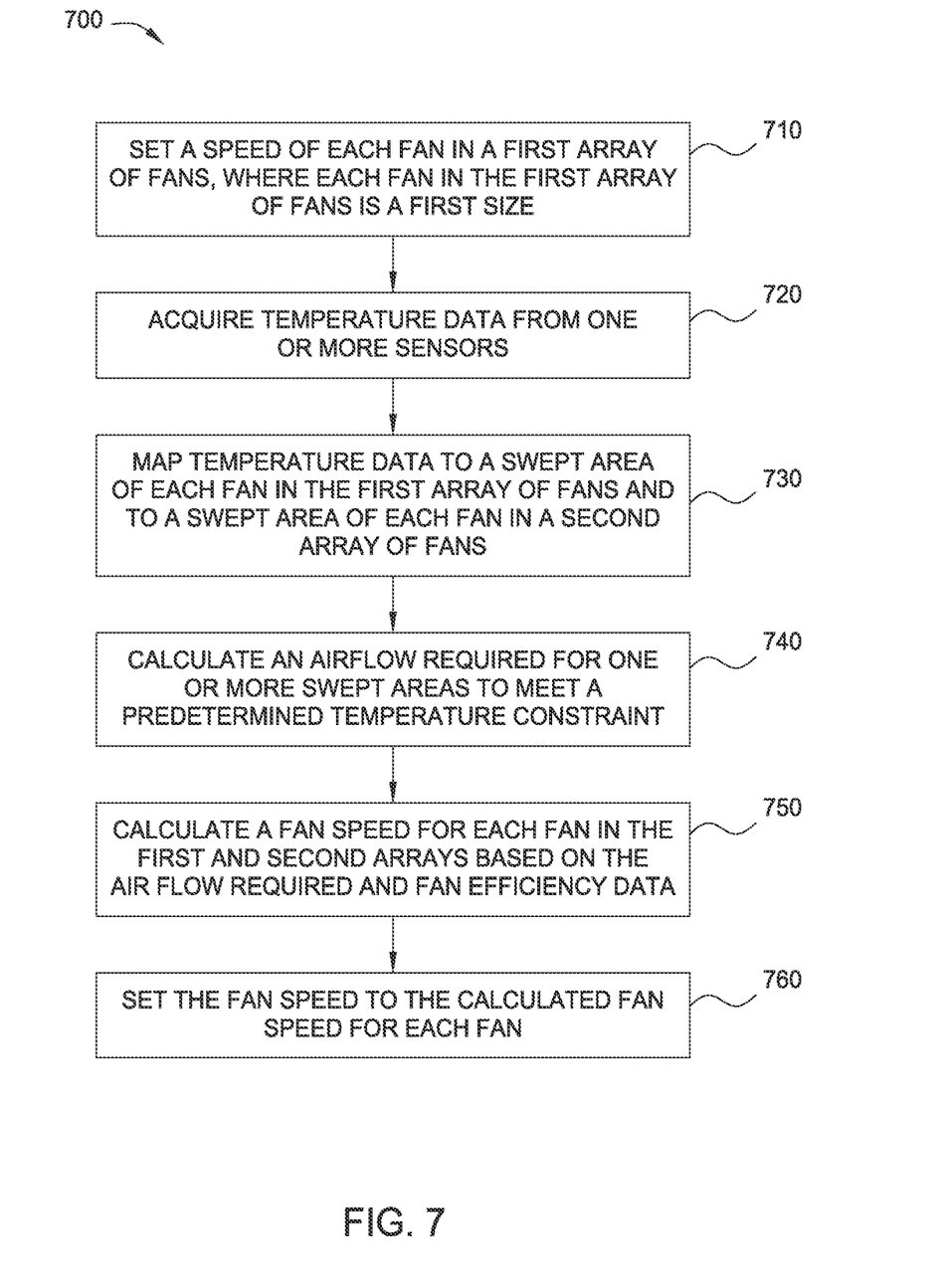
FIG. 7 illustrates another flowchart of a method for cooling a heat generating enclosure, according to one embodiment disclosed herein.

FIG. 7 is a flowchart of a method for cooling a heat generating enclosure, according to an embodiment. Although the method steps are described in conjunction with the systems of FIGS. 1-5, persons skilled in the art will understand that any system configured to perform the method steps, in any order, falls within the scope of the present invention. In various embodiments, the hardware and/or software elements described above in FIGS. 1-5 can be configured to perform the method steps of FIG. 7. In some embodiments, the components illustrated in FIGS. 1-5, such as the fan control unit 130 and measuring unit 140, may perform some or all of the steps in FIG. 7, utilizing hardware and/or software.

The method 700 begins at step 710, where a fan control unit sets a speed of each fan in a first array of fans, where each fan in the first array of fans is a first size. The speeds of the fans may be set individually, or the speed of the fans may be set in groups.

The method proceeds to step 720, where a measuring unit acquires temperature data from one or more sensors within the heat generating enclosure. Any appropriate sensor may be used to acquire the temperature data. In other embodiments, other process variables may be utilized, such as hardware or processing instruction process variables.

The method proceeds to step 730, where temperature data is mapped to a swept area of each fan in the first array of fans and to a swept area of each fan in a second array of fans. The second array of fans is in series to the first array of fans and each fan in the second array of fans is a second size. Fan control unit 130 may map the temperature data in some embodiments.

At step 740, fan control unit 130 calculates an airflow required for one or more swept areas to meet a predetermined temperature constraint (i.e., an optimization criterion). The predetermined temperature constraints may be based on process variables associated with the swept areas. The predetermined temperature constraint may be different for each of the swept areas.

At step 750, fan control unit 130 calculates a fan speed for each fan in the first array and the second array based on the airflow required and fan efficiency data. The fan control unit 130 may use any other suitable variables to calculate the fan speed in other embodiments. The fan speed will optimally provide cooling so that the swept areas meet the predetermined temperature constraint.

At step 760, the fan speed is set to the calculated fan speed for each fan in the first array and each fan in the second array. Thus, the method determines and implements a cooling strategy to cool the heat generating enclosure. In other embodiments, the fan speeds may be set for only one of the fan arrays.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A system for cooling a heat-generating enclosure, comprising:

a first array of one or more fans of a first size, wherein the first array of fans is arranged to provide a baseload cooling flow to a plurality of high-heat sections and low-heat sections of a plurality heat-generating sections within the heat-generating enclosure and a targeted cooling flow for a first number of high-heat sections of the plurality of high-heat sections;

a second array of one or more fans of a second size smaller than the first size, wherein the second array is in series to the first array, wherein each fan in the second array of fans is arranged to provide a cooling flow to a targeted subset of the plurality of heat-generating sections comprising a second number of high-heat sections of the plurality of high-heat sections, wherein the second number of high-heat sections is less than the first number of high-heat sections;

a measuring unit configured to measure at least one process variable; and a control unit configured to implement a cooling strategy for the heat-generating enclosure, wherein the cooling strategy is implemented by controlling each of the fans in the first array and each of the fans in the second array based on the cooling strategy, wherein the cooling strategy is calculated based on the process variable, a first cooling efficiency of the fans in the first array based on acoustics or a power usage of the fans in the first array, a second cooling efficiency of the fans in the second array based on acoustics or a power usage of the fans in the second array, a third number of the plurality of high-heat sections and low-heat sections, and one or more locations of the plurality of high-heat sections and low-heat sections.

2. The system of claim 1, further comprising:

a third array of one or more fans of a third size, where the third array is in series to the first array and the second array; and wherein the control unit is further configured to control at least one of the fans in the third array to achieve an optimization criterion.

3. The system of claim 2, wherein the control unit is configured to individually control each of the fans in the first array, the second array, and the third array.

4. The system of claim 1, wherein the process variable is temperature.

5. The system of claim 1, wherein the fans in the first array and the second array are controlled to achieve a temperature specification while minimizing a fan noise.

6. The system of claim 1, wherein the control unit is configured to control at least one of the fans in the first array or at least one of the fans in the second array based on the process variable in order to provide a minimum required amount of cooling.

7. The system of claim 1, wherein the control unit can control the speed of each of the fans in the first array and the second array.

8. The system of claim 1, wherein the control unit is further configured to increase or decrease the speed of one or more fans in the second array, based on the process variable.

9. The system of claim 1, wherein the control unit is configured to turn on one or more fans in the second array of one or more fans to target a subset of heat-generating components within the heat-generating enclosure, based on the process variable.

10. The system of claim 1, wherein the second cooling efficiency is different from the first cooling efficiency, wherein the first cooling efficiency of the fans in the first array is further based on
- a temperature specification of the fans in the first array,
- wherein, the second cooling efficiency of the fans in the second array is further based on
- a temperature specification of the fans in the second array.

11. The system of claim 1, wherein the cooling strategy is further calculated to preserve component life for a heat-generating component within the heat-generating enclosure.

* * * * *